United States Patent [19]

Bertsch et al.

[11] Patent Number: 5,485,095

[45] Date of Patent: Jan. 16, 1996

[54] FABRICATION TEST CIRCUIT AND METHOD FOR SIGNALLING OUT-OF-SPEC RESISTANCE IN INTEGRATED CIRCUIT STRUCTURE

[75] Inventors: John E. Bertsch, Essex; Randy W. Mann, Jericho; Edward J. Nowak, Essex; Minh H. Tong, Essex Junction, all of Vt.

[73] Assignee: International Business Machines Corporation, Armonk, N.Y.

[21] Appl. No.: 337,342

[22] Filed: Nov. 10, 1994

[51] Int. Cl.[6] .................................................. G01R 31/02
[52] U.S. Cl. .......................... 324/537; 324/525; 324/763; 324/765; 371/22.5
[58] Field of Search .................................. 324/512, 525, 324/537, 554, 763, 765, 766; 371/22.5, 22.6

[56] References Cited

U.S. PATENT DOCUMENTS

| | | | |
|---|---|---|---|
| 3,808,527 | 4/1974 | Thomas | 324/716 |
| 3,983,479 | 9/1976 | Lee et al. | 324/537 |
| 4,100,486 | 7/1978 | Casowitz et al. | 324/719 |
| 4,144,493 | 3/1979 | Lee et al. | 324/765 |
| 4,516,071 | 5/1985 | Buehler | 324/765 |
| 4,575,714 | 3/1986 | Rummel | 340/568 |
| 4,835,466 | 5/1989 | Maly et al. | 324/537 |
| 4,918,377 | 4/1990 | Buehler et al. | 324/691 |
| 4,952,871 | 8/1990 | Driller et al. | 324/754 |
| 5,006,809 | 4/1991 | Mang et al. | 324/715 |

*Primary Examiner*—Kenneth A. Wieder
*Assistant Examiner*—Glenn W. Brown
*Attorney, Agent, or Firm*—Heslin & Rothenberg

[57] ABSTRACT

Test circuits and methods for accurately flagging out-of-spec resistance in a current carrying structure of an integrated circuit employ a plurality of monitor structures connected in parallel and a test means for monitoring the monitor structures. Each monitor structure includes a test structure and an associated threshold sensitive device. Each test structure is predesigned relative to the current carrying structure of the integrated circuit such that an out-of-spec resistance in the test structure signals a possible out-of-spec resistance in the current carrying structure. The threshold sensitive device of each monitor structure outputs a fail signal when resistance of the associated test structure is above a predefined level. The fail signal is representative of an out-of-spec resistance in the associated test structure and flags possible out-of-spec resistance in the current carrying structure. The test means simultaneously monitors the plurality of monitor structures for a fail signal. An automated test device is also disclosed for providing a binary count representative of a total number of out-of-spec test structures.

33 Claims, 5 Drawing Sheets

FABRICATION TEST CIRCUIT AND METHOD FOR SIGNALLING OUT-OF-SPEC RESISTANCE IN INTEGRATED CIRCUIT STRUCTURE

TECHNICAL FIELD

This invention relates in general to fabrication and testing of integrated circuits and, in particular, to a test circuit and method for monitoring an integrated circuit fabrication process for possible out-of-spec resistance shift or other conductivity defect in a given current carrying structure within the integrated circuit.

BACKGROUND ART

Reliability and performance of integrated circuits (ICs) are significant considerations both in terms of fabrication and subsequent use of the circuits. Attempts are continually being made to ensure high reliability at all stages of the fabrication process. Many IC current carrying structures, such as contact pads, vias, and diffusion lines, can not be readily isolated for reliability and performance testing. In such cases, special test sites, for example, in the kerf region of an integrated circuit chip, are provided for reporting fabrication reliability information on one or more particular type of structure forming part of the active integrated circuitry.

As a specific example, reliability testing of silicided polysilicon field-effect transistor (FET) gates is discussed herein. Testing of such structures conventionally relies on a long, serpentine test structure representative of the polysilicon resistance (PCRS) of a large number of such gate structures. Monitoring of this serpentine structure, which may approach 1000 microns in length, can detect discrete or catastrophic type defects resulting from the fabrication process. Unfortunately, minor out-of-spec shifts in PCRS are often masked and therefore missed. This is because the conventional practice is to determine a total resistance for the serpentine structure and from that calculate an average resistance value for an individual silicided polysilicon gate by dividing the total resistance of the serpentine structure by the corresponding number of gates-whose dimensions comprise such a structure, which can be several hundred. Thus, an individual gate or even several gate structures can be out-of-spec without the resultant "average" resistance value obtained from monitoring the long serpentine test structure reflecting such a condition.

Thus, although the conventional approach works well with discrete defects such as particle or dirt induced defects, it often fails to adequately identify random process induced resistance shifts such as occurring during conversion of polysilicon to silicided polysilicon. Research has shown that silicidation of polysilicon occurs in two stages. Upon application of heat to appropriately doped polysilicon, a first type of silicide is formed having a sheet resistance of approximately 16–20 ohms per square. When this first type of silicide is again heat treated, a second type of silicide is produced having significantly lower sheet resistance, e.g., approximately 4–5 ohms per square. The process of forming the silicide, referred to in the art as transformation, is sensitive-both to overheating and to insufficient uniform heating. If overheated, the silicide will melt, thereby forming a discrete defect. Conversely, if insufficiently uniformly heated, for example, to transform the first type of silicide (16–20 ohms per square) into the second type of silicide (4–5 ohms per square), then some areas of the integrated circuit will have "out-of-spec" PCRS. Such resistance variations may degrade performance or even result in circuit failure if, for example, the out-of-spec structure is disposed in a critical timing path. Depending upon the dimensions of the silicided polysilicon gates, the probability of the first type of silicide remaining upon completion of fabrication processing can be high, resulting in a bi-modal sheet resistance distribution for the silicided polysilicon gates across the integrated circuit.

Because the difference between non-shifted PCRS and shifted PCRS is relatively small, e.g., 12–15 ohms per square, the conventional averaging approach is ineffective in identifying limited numbers of such out-of-spec structures. Thus, a need exists for a more sensitive test circuit and test method for signalling possible out-of-spec resistance shifts, or other type of defect, in a current carrying structure of an integrated circuit.

DISCLOSURE OF INVENTION

Briefly summarized, the invention comprises in a first aspect a fabrication test circuit for signalling possible out-of-spec resistance in a current carrying structure of an associated integrated circuit. The fabrication test circuit includes a plurality of monitor structures electrically connected in parallel. Each monitor structure has an associated test structure and threshold sensitive device. Each test structure is predesigned relative to the current carrying structure of the integrated circuit such that an out-of-spec resistance in the test structure signals a possible out-of-spec resistance in the current carrying structure. The threshold sensitive device of each monitor structure outputs a fail signal when a resistance proportional signal from the associated test structure exceeds a predefined level, the fail signal being representative of out-of-spec resistance in the associated test structure and possible out-of-spec resistance in the current carrying structure of the integrated circuit. Monitor means are provided for monitoring the plurality of monitor structures for a fail signal output from at least one monitor structure.

In another aspect, an automated fabrication test device is provided comprising a plurality of monitor structures and an automated count means for monitoring thereof. The monitor structures are electrically connected in parallel with each structure comprising an associated test structure and a threshold sensitive switch device. Each test structure is predesigned relative to a current carrying structure of an associated integrated circuit such that an out-of-spec resistance in the test structure signals a possible out-of-spec resistance in the current carrying structure. The threshold sensitive switch device of each monitor structure outputs a fail signal when resistance of the associated test structure is above a predefined level. The fail signal is representative of an out-of-spec resistance in the associated test structure and possible out-of-spec resistance in the current carrying structure of the associated integrated circuit. The automated count means monitors the plurality of monitor structures for a fail signal output from at least one of said monitor structures, and accumulates a total count based on each fail signal output from the monitor structures.

In still another aspect, a method is provided for fabricating a test device for indicating possible out-of-spec resistance in a current carrying structure of an integrated circuit. The method includes the steps of: predesigning a plurality of monitor structures such that each monitor structure has an associated test structure and threshold sensitive switch device, each test structure being predesigned relative to the current carrying structure of the integrated circuit such that an out-of-spec resistance in the test structure signals a possible our-of-spec resistance in the current carrying structure, the threshold sensitive switch device of each monitor structure being designed to output a fail signal when resistance of the associated test structure is above a predefined level, the fail signal being representative of an out-of-spec resistance in the associated test structure; and fabricating the plurality of monitor structures such that the monitor structures are electrically connected in parallel and are disposed adjacent to the integrated circuit.

To restate, a test circuit and test method are provided for integrated circuit fabrication monitoring which provide enhanced detection resolution, particularly of certain types of out-of-spec resistance shifts, such as PCRS shifts. Along with identifying the occurrence of out-of-spec fails in one or more monitor structures, the location thereof about the associated integrated circuit can be readily isolated. If desired, out-of-spec fails in the test circuitry can be automatically counted and a total count digitally output, along with an indication of location of failed test structures. In addition to detecting out-of-spec fails, the techniques presented can also be employed to monitor the occurrence of discrete defects in polysilicon, as well as in other types of current carrying structures within the integrated circuit. For example, the method could be used to detect high contact resistance at contact pads, or degraded conductance within a diffusion line or metal via.

BRIEF DESCRIPTION OF THE DRAWINGS

These and other objects, advantages and features of the present invention will be more readily understood from the following detailed description of certain preferred embodiments of the invention, when considered in conjunction with the accompanying drawings in which:

FIG. 7 is a timing diagram of the ENABLE and DATA OUTPUT signals of the automated test device of

BEST MODE FOR CARRYING OUT THE INVENTION

Figure 1:
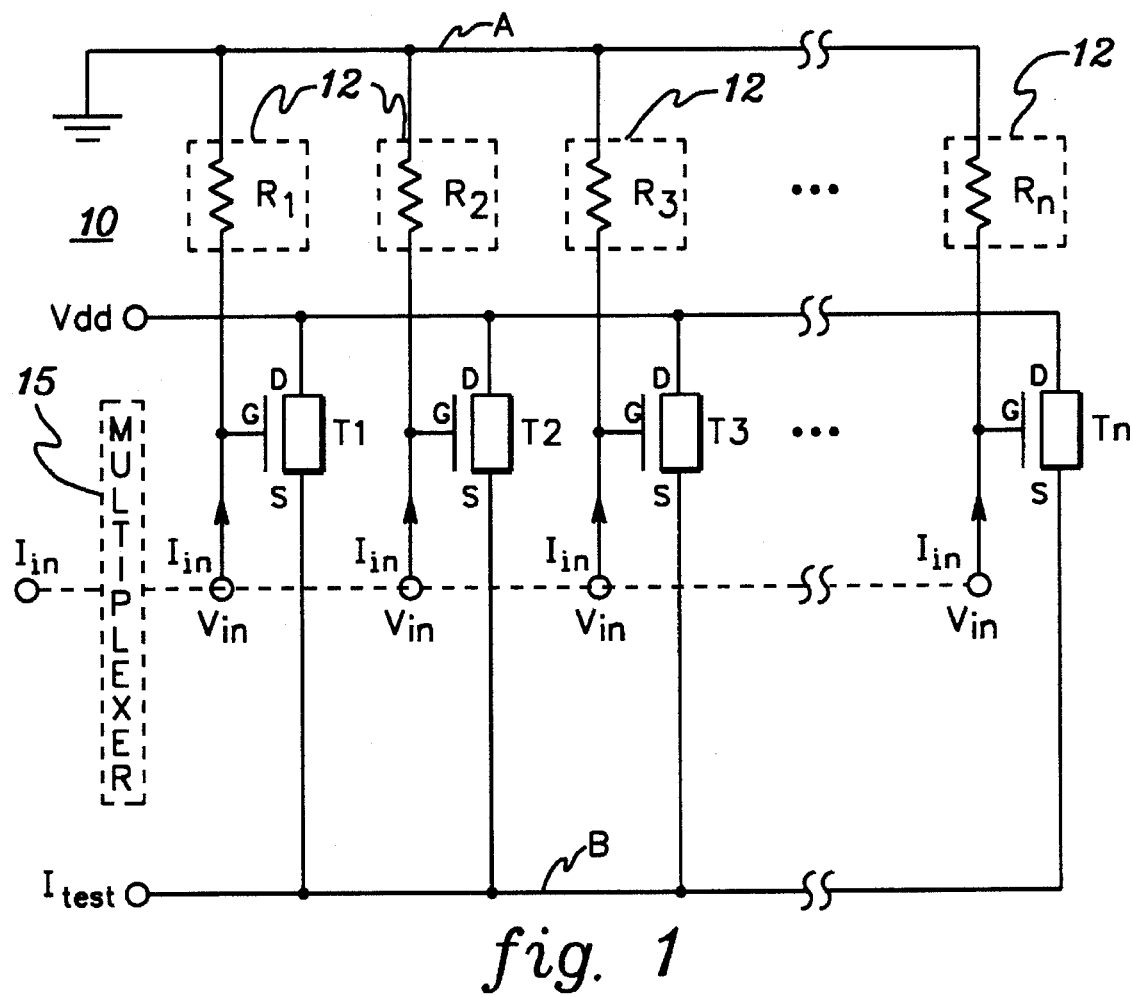
FIG. 1 is a schematic of one embodiment of a test circuit in accordance with the present invention.

In the embodiments discussed below, various test circuits and methods are presented for signalling possible out-of-spec resistance in a current carrying structure of an associated integrated circuit. Each test circuit and method employs a threshold sensitive device in association with a test structure predesigned to have a sheet resistance corresponding to the sheet resistance of the current carrying structure to be monitored. As a specific example, the current carrying structure is assumed to comprise one or more field-effect transistor (FET) gates composed of polysicilicon and having a silicided polysilicon sheet resistance (PCRS) to be monitored. However, those skilled in the art should recognize that the principles presented herein are equally applicable to monitoring of a continuum of resistance values, and not just to monitoring a bi-modal resistance distribution such as that of PCRS. Further, and unless otherwise apparent, the term "out-of-spec" as used herein encompasses any resistance shift or conductance degradation, for example, resulting from incomplete silication, as well as discrete defects.

In the embodiments presented, the test circuits include complementary metal-oxide semiconductor (CMOS) circuits with P-channel field-effect transistors (PFETs) indicated in the drawings by a rectangle with a diagonal line formed therein and a control element or gate electrode arranged adjacent thereto and with N-channel field-effect transistors (NFETs) indicated by a rectangle without a diagonal line formed therein but with a control element or gate electrode arranged adjacent thereto.

FIG. 1 presents a first embodiment of a test circuit, generally denoted 10, in accordance with the present invention. Circuit 10 includes a plurality of test structures 12 each of which has an associated non-linear, threshold sensitive device, i.e., FETs T1, T2, T3 , . . . , Tn. Each test structure and associated non-linear device comprises a monitor structure, whereby circuit 10 includes a plurality of monitor structures each having a test structure and an associated non-linear, threshold sensitive FET. As shown, each test structure 12 connects to the gate 'G' of the associated FET T1, T2, T3 . . . Tn. These FETs comprise non-linear devices having commonly coupled drains 'D' and commonly coupled sources 'S'. The drains 'D' are connected to a supply voltage Vdd, while an output test signal $I_{test}$ is provided through the respective FET sources 'S'.

Each monitor structure is driven by a current input $I_{in}$. In accordance with the invention, the input current nodes may be electrically tied together for simultaneous testing of all "n" monitor structures, or multiplexed together through a multiplexer 15 (shown in phantom). Through multiplexing, any number of test structures in the "n" monitor structures connected in parallel may be simultaneously monitored. Further, a histogram of current versus test structure resistance can be generated by sequentially multiplexing current input $I_{in}$ to the various nodes.

The electrically parallel-connected monitor structures are disposed between a first common node A and a second common node B. In this embodiment, node A is grounded, while node B outputs the test current $I_{test}$ from the various monitor structures. Each test structure 12 ($R_1$, $R_2$, $R_3$ , . . . $R_n$) is predesigned with a sheet resistance corresponding to that of the current carrying structure, e.g., FET gate, in the associated integrated circuit undergoing process monitoring.

Each test structure 12 preferably has similar if not identical dimensions to the current carrying structure being monitored. If size variation in the current carrying structure exists, then test structures 12 might have a dimension comprising to a narrowest width of the current carrying structure and an average length thereof. The narrowest width is critical since the narrower the structure, the more sensitive polysilicon is to improper silicidation. By way of specific example, for monitoring silicided polysilicon, each test structure 12 can be structured as follows:

$$R_{nom} \cong V_T/4 \; (I_{in}) = \frac{\rho_{CS4} \times l}{t \times w}$$

wherein:

$R_{nom}$=nominal resistance of a test structure, $V_T$=threshold voltage of the associated FET, $I_{in}$=test current input to test circuit, $\rho_{CS4}$=resistivity of the polysilicon test circuit, l=test structure length, t=test structure thickness, and w=test structure width.

By so defining the nominal sheet resistance of the test structure, the field-effect transistor's subthreshold slope (discussed below) can be employed to amplify slight variations in resistance of the test structures.

Figure 2:
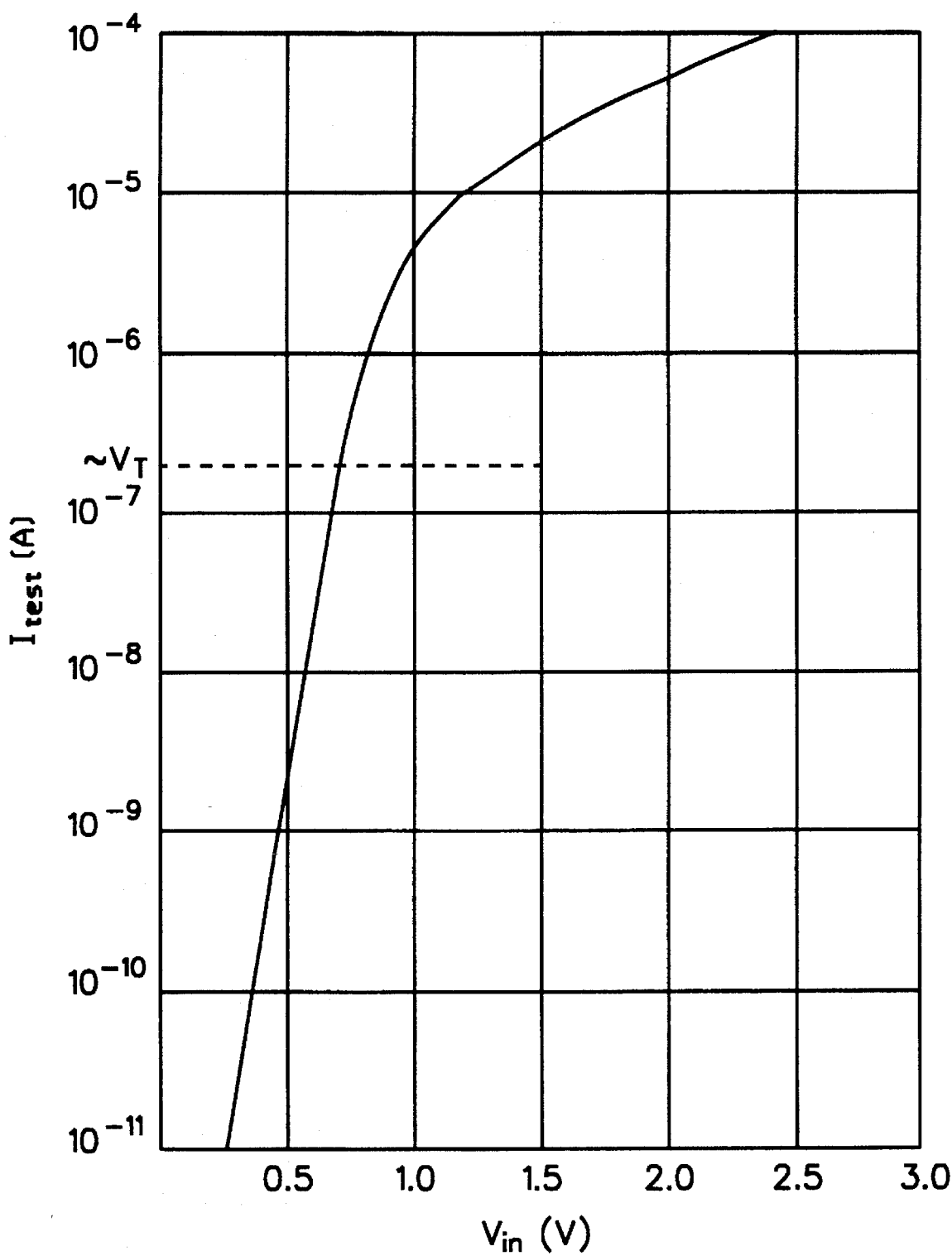
FIG. 2 is a plot of current versus voltage characteristic for a field-effect transistor device employed in the test circuit embodiment of FIG. 1.

FIG. 2 depicts in log scale a conventional current versus voltage characteristic for a field-effect transistor, such as NFETs T1, T2, T3, etc. Preferably, input current $I_{in}$ to NFETs T1, T2, T3 ... Tn is set in the sub-threshold region of each transistor's characteristic. In the sub-threshold region, output current $I_{test}$ increases exponentially with small increases in control voltage $V_{in}$ at the gate. This significant current amplification is employed in this embodiment of the invention to "detect" an out-of-spec test structure.

In the sub-threshold operational range, good sensitivity to variations in resistance is attained. A resistance change from, for example, 4–5 ohms per square to 16–20 ohms per square will create a small voltage $V_{in}$ change at the gate but a significant current $I_{test}$ change at the source of the respective non-linear device T1, T2, T3, etc. This exponential current $I_{test}$ change at the FET output comprises a flag that the associated test structure is out-of-spec. Because current does increase exponentially, a single out-of-spec structure can be identified notwithstanding simultaneous monitoring of a plurality of test structures. For example, as shown in FIG. 2, in the sub-threshold range a 0.1 to 0.2 variation in gate voltage $V_{in}$ produces a 20–40× change in test current $I_{test}$ output from the FET.

Since silicided polysilicon sheet resistance (PCRS) has a bi-modal resistance distribution between in spec and out-of-spec, the number of test structures 12 having out-of-spec resistance can be readily determined from current $I_{test}$. However, even if the structure under test has a continuum type distribution when out-of-spec, it is still possible to detect that at least one test structure is out-of-spec, and through empirical data, it may even be possible to deconvolve a test current $I_{test}$ output to determine within a certain probability the number of out-of-spec test structures. Typically, however, the manufacturing sector is interested in simply knowing whether or not a process has completely produced a desired structure. Thus, if only one test structure is out-of-spec, detailed analysis would typically be conducted to determine the extent and location of failure.

Ideally, the monitor structures are disposed on a semiconductor wafer in close proximity to the integrated circuit(s) so that they experience the same process variations and mechanical forces. The test structures can be disposed over inactive portions of the wafer, for example, in a kerf region of an integrated circuit or conceivably, in a designated test chip on the wafer. As a further variation, the test structures could be disposed over active chip portions of the wafer, i.e., assuming that there is available space. Again, a primary consideration is that the test structures be located in close proximity to the current carrying structure in order to be subject to similar process variations. If desired, the test circuit can be designed in a robust manner to be insensitive to certain process defects, yet still sensitive to PCRS problems.

Figure 3:
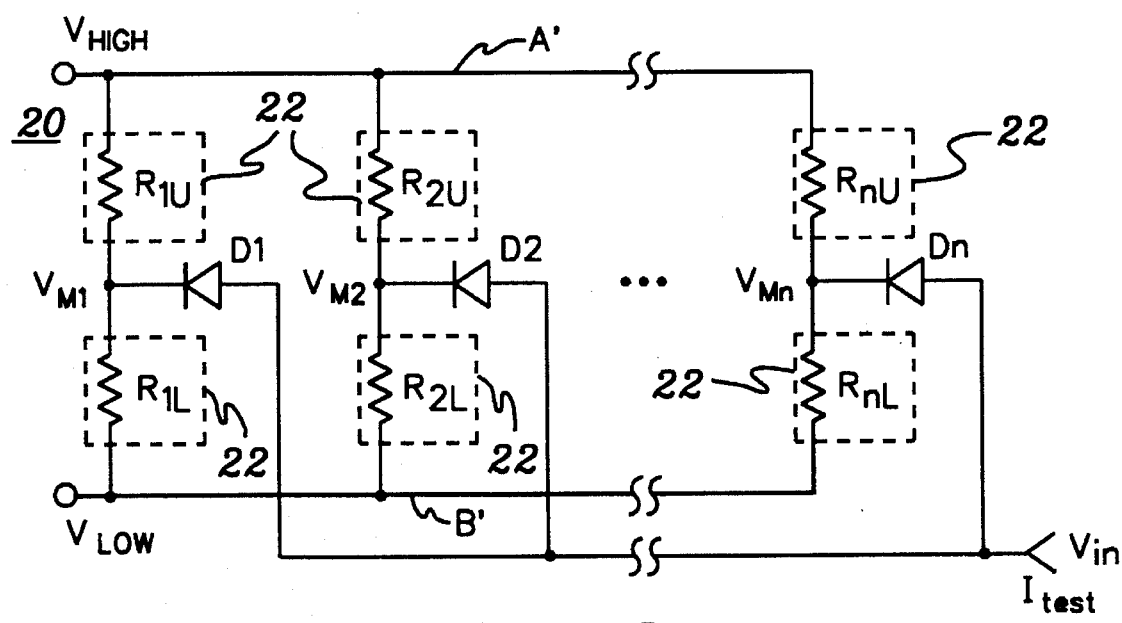
FIG. 3 is a schematic of another embodiment of a test circuit in accordance with the present invention.

FIG. 3 depicts another embodiment of a fabrication test circuit, generally denoted 20, in accordance with the present invention. As shown, multiple monitor structures are again electrically connected in parallel within the test circuit. Each monitor structure is composed of two series connected test structures 22 disposed between a first common node A' coupled to a high voltage $V_{HIGH}$, and a second common node B', coupled to a low voltage. Input to circuit 20 is a test signal $I_{test}$ fed in parallel across respective forward-biased diodes D1, D2 ... Dn to the common connect nodes between test structures 22 within the monitor structures.

The circuit includes a first plurality of test structures in an upper portion of the test circuit, labeled $R_{1U}, R_{2U} \ldots, R_{nU}$, and a second plurality of test structures in the lower portion of the circuit, labeled $R_{1L}, R_{2L} \ldots, R_{nL}$. Again, each test structure 22 is predesigned to have a sheet resistance equivalent to that of the current carrying structure (not shown) being monitored. Dimensional considerations for structures 22 are similar to those discussed above in connection with the test structures of FIG. 1. Diodes D1, D2, ..., Dn isolate the input node voltage $V_{in}$ from the common connect node voltages $V_{M1}, V_{M2} \ldots V_{Mn}$. This, in this embodiment a monitor structure consists of two resistive legs $R_{1U}$ & $R_{1L}$, $R_{2U}$ & $R_{2L}$, ... $R_{nU}$ & $R_{nL}$ and an associated threshold sensitive diode D1, D2, ..., Dn, respectively.

Operationally, the voltage $V_M$ at the common connect node within each monitor structure should equal $V_{HIGH}$ divided by two if the corresponding test structures 22 are both in spec. Device and voltage values are selected such when in spec that the corresponding diode (D1, D2 ..., Dn) conducts a known amount of current $I_{test}$ for a given input voltage $V_{in}$. If the voltage required to force a test current $I_{test}$ through the associated diode(s) D1, D2, ... Dn increases, then an out-of-spec resistance is identified.

Figure 4:
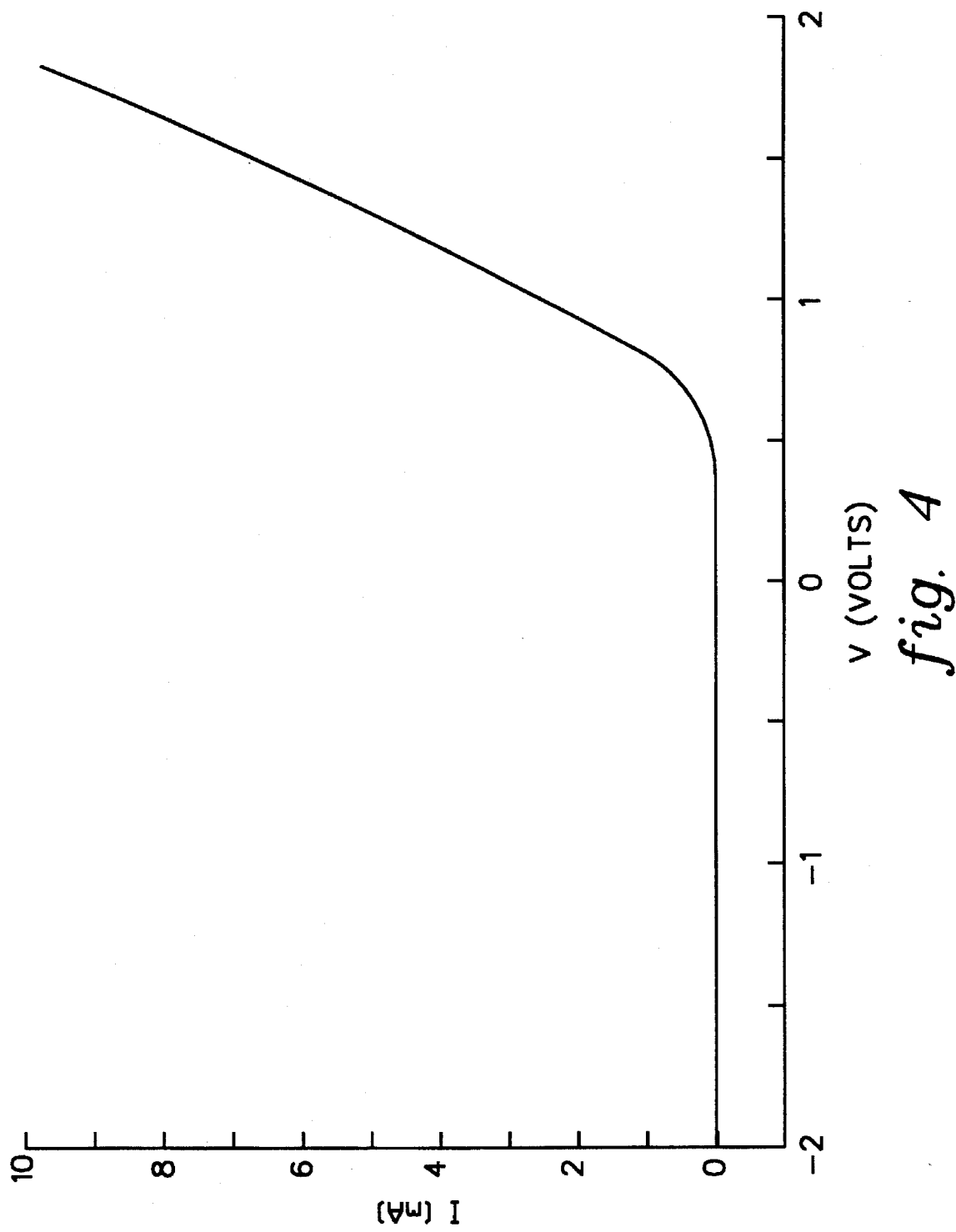
FIG. 4 is a plot of current versus voltage characteristic for a diode device employed in the test circuit embodiment of FIG. 3.

By way of example, if three volts is applied across a series connection of resistors in one monitor structure, and if both resistors are in spec, the voltage at the common connect node $V_M$ will be 1.5 volts. Therefore, in order to drive a test current to the common connect node, an input voltage $V_{in}$ at the current test node of approximately 2.1 volts will be needed. In this regard, reference the typical current-voltage characteristic for a diode of FIG. 4, wherein the diode begins conducting at approximately 0.6 volts. In contrast, if one resistor of the voltage divider is out-of-spec, with a resistance of 16–20 $\Omega s/\square$, then the common connect node voltage $V_M$ will be approximately 2.5 volts and the input voltage $V_{in}$ necessary to drive current to the common connect node will increase to approximately 3.1 volts. These numbers assume that the individual test structures comprise silicided polysilicon having the bi-modal in spec/out-of-spec distribution discussed above. The remaining in-spec monitor structures will begin conducting current at the lower 2.1 volt level.

If desired, the input voltage $V_{in}$ and test current $I_{test}$ could be multiplexed in a manner similar to that shown in connection with the input current $I_{in}$ of FIG. 1. If multiplexed, then detailed information on each monitor structure can be obtained. Further, note that if simultaneously measured it is possible to determine the number of test structures that have failed, at least in a bi-modal PCRS implementation of test structures 22, but location information will require separate analysis. Advantageously, fabrication test circuit 20 of FIG. 3 is easy to implement early in the fabrication process.

In order to reduce the amount of manual testing, an automated test device is disclosed below with reference to FIGS. 5–7.

Figure 5:
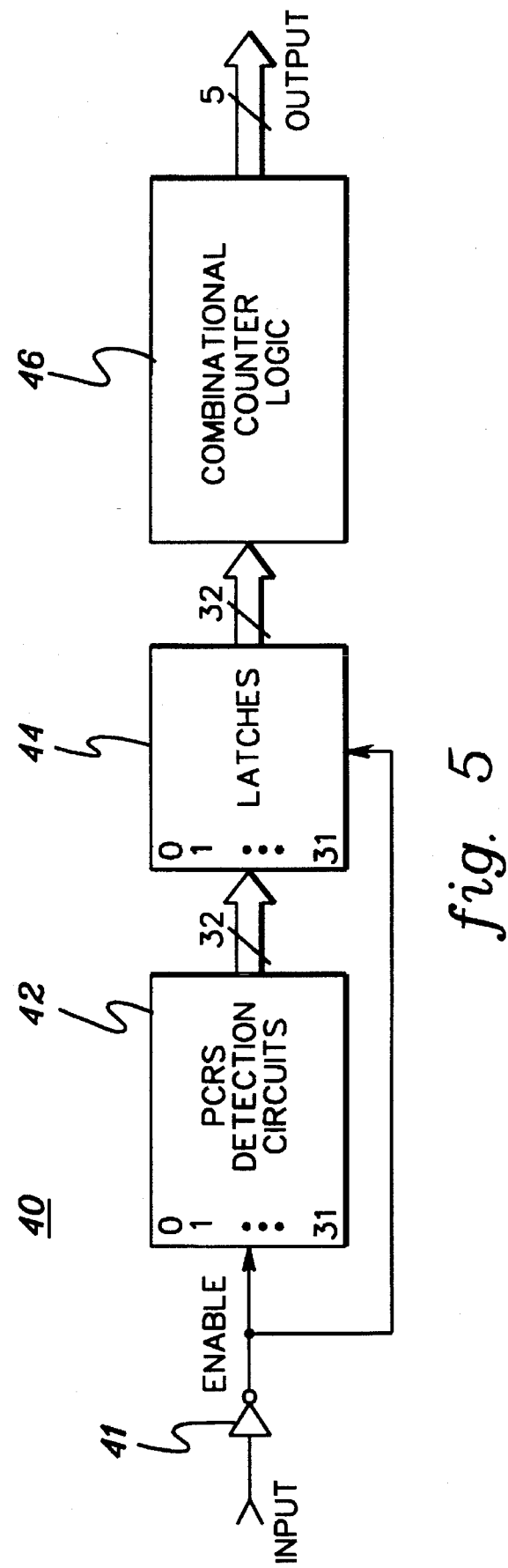
FIG. 5 is a block diagram of an automated test device in accordance with the present invention.

FIG. 5 depicts one embodiment of an automated fabrication test device, generally denoted 40. Principal components of device 40 include a plurality of PCRS detection circuits 42, a corresponding plurality of latches 44, and combinational counter logic 46. In the embodiment shown, thirty-two separate detection circuits and corresponding latches are assumed. Data from latches 44 is counted in combinational counter logic 46, the output of which comprises a binary signal representative of the total number of out-of-spec test structures in PCRS detection circuits 42. The device is controlled by an input "ENABLE" signal, which is buffered by an inverter 41 before being fed to PCRS detection circuits 42 and to latches 44.

Figure 6:
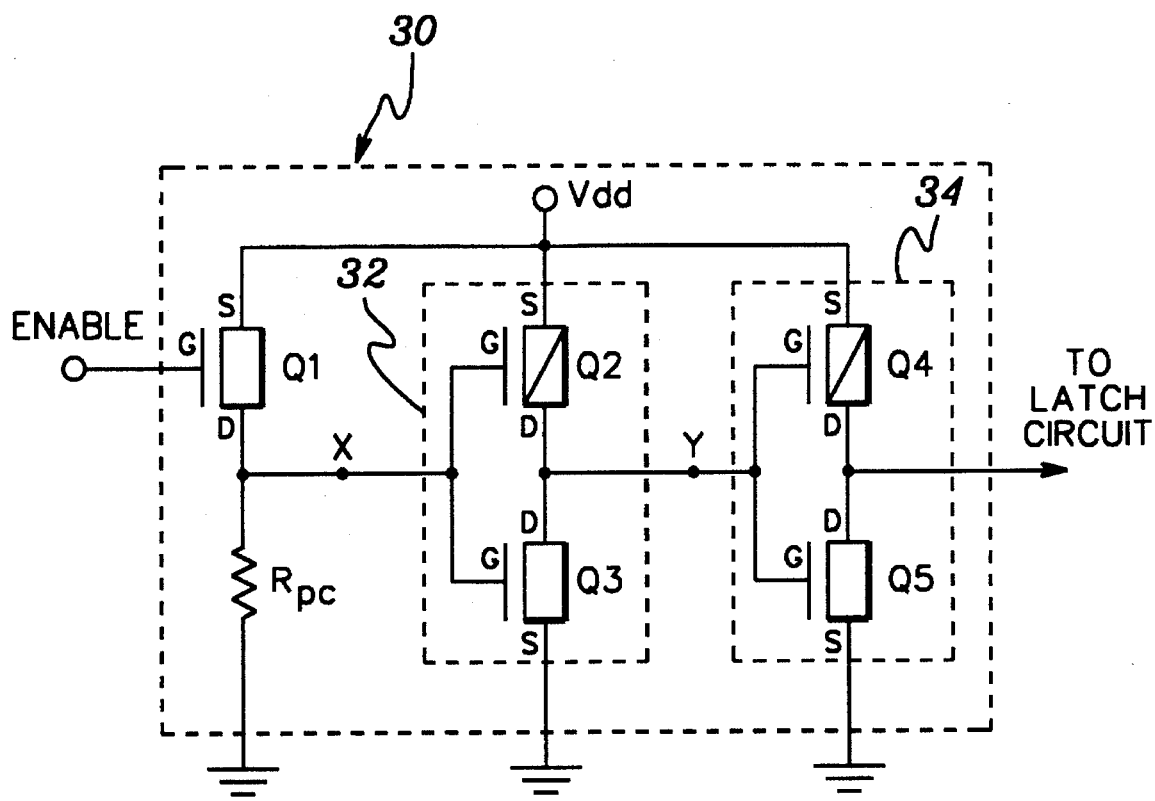
FIG. 6 is a schematic of one embodiment of one detection circuit repeated thirty-two times in the PCRS detection circuits of the automated test device of FIG. 5.

One embodiment of a single detection circuit 30 is shown in FIG. 6. This circuit is implemented thirty-two times within PCRS detection circuits 42 of FIG. 5. An NFET Q1 of detection circuit 30 and silicided polysilicon resistor $R_{PC}$ are designed such that the voltage level at node 'X' is below the threshold voltage $V_T$ of an NFET Q3 comprising part of a voltage amplifier 32, which is responsive to the voltage at node 'X'. Amplifier 32 also includes a PFET Q2 connected as shown with the output node 'Y' at the commonly coupled drains 'D' of NFET Q3 and PFET Q2. NFET Q3 is sized larger than PFET Q2 so that it will pull node 'Y' low when turned on. The signal at node 'Y' is fed to a buffer 34 comprising a PFET Q4 and an NFET Q5 before being output to latches 44 (FIG. 5).

Operationally, the voltage at node 'X' is maintained below a threshold voltage $V_T$ of NFET Q3 when silicided polysilicon resistance $R_{PC}$ is in spec, and hence the output voltage at node 'Y' remains high. If there is a defect or process variation resulting in an out-of-spec resistance at $R_{PC}$ sufficient, for example, to cause PCRS $R_{PC}$ to increase by about 4 times, node 'X' voltage will increase above threshold voltage $V_T$ of NFET Q3, thereby pulling voltage at node 'Y' low. (Again, note that device Q2 is designed to be small relative to device Q3 so that NFET Q3 can pull down node 'Y' whenever node 'X' voltage is higher than the threshold voltage $V_T$ of that device.) The output voltage at node 'Y' is buffered by an inverter 34 before being fed to latches 44 (FIG. 5).

As numbered in FIG. 5, latches 44 also comprises thirty-two latches implemented in parallel, each latch receiving an output from a respective detection circuit of the PCRS detection circuits 42. By using multiple PCRS detection circuits and latches, simultaneous PCRS detection is accomplished simply by bringing the "ENABLE" signal high. After a specified hold time the number of PCRS fails can be read in binary number through the use of combinational counter circuit 46 connected to receive the output of latches 44. Note that the five bit binary output from logic 46 can represent a total number of fails or, alternatively, the location of a single failed test structure within the thirty-two detection circuits of the device, i.e., assuming that the "ENABLE" signal is multiplexed through the detection circuits.

Figure 7:
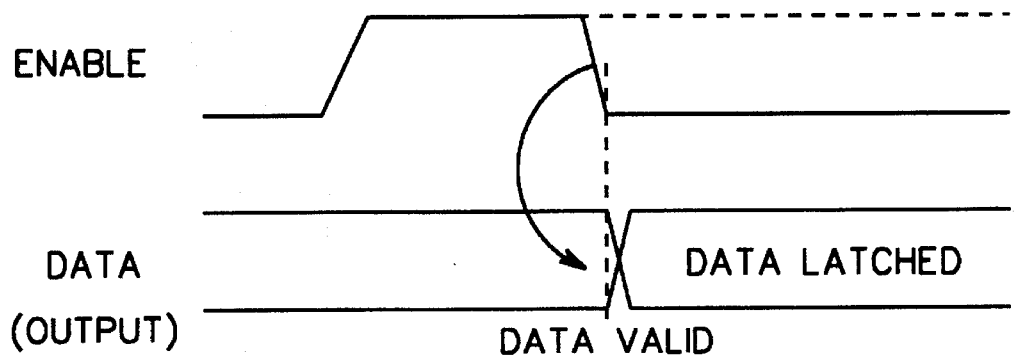

FIG. 7 is a timing diagram showing the brief delay interval between activation of the "ENABLE" signal and the occurrence of valid data at the data output of the device. The time delay, for example, less than 20 nanoseconds, between the "ENABLE" signal going high and the latching of valid data will vary with technology.

As an enhancement, a fabrication test circuit may be disposed about a given integrated circuit on a wafer having multiple fabrication test circuits present, each of which monitors a different integrated circuit on the wafer. Thus, resistance monitoring can be readily accomplished by separately testing the fabrication test devices for a total number of failures on a wafer, and if present, the general location of any fails on the wafer will be known by the location of the test circuit signalling the failure. As an example, 1000 or more test structures may be employed on a wafer to provide a sufficient level of confidence in a fabrication process.

From the above discussion, those skilled in the art will note that a test circuit and test method have been provided for integrated circuit fabrication monitoring which have enhanced detection resolution, particularly of certain types of out-of-spec resistance shifts, such as PCRS shifts. Along with identifying the occurrence of out-of-spec fails in one or more monitor structures, the location thereof about the associated integrated circuit can be readily isolated. If desired, out-of-spec fails in the test circuitry can be automatically counted and a total count digitally output, along with an indication of location of failed test structures. In addition to detecting out-of-spec fails, the techniques presented can also be employed to monitor the occurrence of discrete defects in polysilicon, as well as in other types of current carrying structures within the integrated circuit. For example, the method could be used to detect high contact resistance at contact pads, or degraded conductance within a diffusion line or metal via. Currently, testing contact pad resistance is similar to the approach described initially herein for screening silicide resistance problems.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A fabrication test circuit for signalling possible out-of-spec resistance in a current carrying structure of an integrated circuit, said fabrication test circuit comprising:

a plurality of monitor structures connected in parallel, each monitor structure comprising an associated test structure and threshold sensitive device, each test structure being predesigned relative to the current carrying structure of the integrated circuit such that an out-of-spec resistance in the test structure signals a possible out-of-spec resistance in the current carrying structure, the threshold sensitive device of each monitor structure outputting a fail signal when a resistance proportional signal from the associated test structure is above a predefined level, said fail signal being representative of out-of-spec resistance in the associated test structure; and means for monitoring said plurality of monitor structures for a fail signal output from at least one monitor structure of the plurality of monitor structures, said fail signal output from said at least one monitor structure signalling possible out-of-spec resistance in the current carrying structure.

2. The fabrication test circuit of claim 1, the threshold sensitive device of each monitor structure outputs a fail signal proportional to the out-of-spec resistance of the associated test structure when the resistance proportional signal from the associated test structure is above the predefined level.

3. The fabrication test circuit of claim 2, wherein the threshold sensitive device comprises a field-effect transistor (FET) and wherein said predefined level of the resistance proportional signal comprises a level in a sub-threshold region of said FET.

4. The fabrication test circuit of claim 1, wherein said means for monitoring includes means for simultaneously monitoring said plurality of monitor structures.

5. The fabrication test circuit of claim 1, wherein said means for monitoring includes means for simultaneously monitoring multiple monitor structures of said plurality of monitor structures.

6. The fabrication test circuit of claim 1, wherein said means for monitoring includes a multiplexer coupled to each of said plurality of monitor structures for selective monitoring of monitor structures in said plurality of monitor structures.

7. The fabrication test circuit of claim 1, wherein the current carrying structure of the integrated circuit has a known sheet resistance when in spec and wherein each test structure is predesigned when in spec with a sheet resistance equal to the known sheet resistance of the current carrying structure.

8. The fabrication test circuit of claim 1, wherein each threshold sensitive device comprises a field-effect transistor (FET), each FET being connected to the associated test structure to non-linearly amplify the resistance proportional signal therefrom, said fail signal comprising a non-linear amplification of said resistance proportional signal.

9. The fabrication test circuit of claim 8, wherein said field-effect transistor of each threshold sensitive device is configured as a non-linear current amplifier and wherein said resistance proportional signal comprises a current signal, said current signal being non-linearly amplified by said field-effect transistor to produce said fail signal when said current signal is above said predefined level.

10. The fabrication test circuit of claim 8, wherein said field-effect transistor of each threshold sensitive device comprises a voltage amplifier and wherein said resistance proportional signal comprises a voltage signal, said voltage signal being non-linearly amplified by said field-effect transistor to produce said fail signal when said voltage signal is above said predefined level.

11. The fabrication test circuit of claim 1, wherein said threshold sensitive device comprises a forward-biased diode.

12. The fabrication test circuit of claim 11, wherein each test structure comprises a first resistor and a second resistor connected together at a common connection node with the forward-biased diode of the associated threshold sensitive device coupled to said common connection node, said first resistor and said second resistor being connected in voltage divider configuration between a high voltage node and a low voltage node.

13. The fabrication test circuit of claim 12, wherein when in spec each first resistor and each second resistor has a sheet resistance corresponding to an in spec sheet resistance of the current carrying structure.

14. The fabrication test circuit of claim 1, wherein said means for monitoring includes means for simultaneously monitoring multiple monitor structures of said plurality of monitor structures, and wherein said means for monitoring further includes means for identifying the at least one monitor structure outputting the fail signal representative of possible out-of-spec resistance in the current carrying structure.

15. The fabrication test circuit of claim 14, wherein said at least one monitor structure outputting said fail signal comprises multiple monitor structures each outputting a fail signal representative of out-of-spec resistance in the associated test structure, and wherein said means for monitoring further comprises means for counting each of said fail signals.

16. The fabrication test circuit of claim 15, wherein said means for counting includes means for providing a binary count signal corresponding to a total count of said fail signals representative of out-of-spec resistance in the associated test structures of the multiple monitor structures outputting said fail signals.

17. The fabrication test circuit of claim 16, wherein said means for monitoring comprises automated means for monitoring said plurality of monitor structures and for providing based thereon said binary count signal corresponding to said total count of fail signals.

18. The fabrication test circuit of claim 1, wherein said integrated circuit comprises multiple integrated circuits, each integrated circuit of said multiple integrated circuits having at least one current carrying structure, and wherein said fabrication test circuit is further in combination with multiple such fabrication test circuits, each fabrication test circuit being associated with one integrated circuit of said multiple integrated circuits for monitoring possible out-of-spec resistance in said at least one current carrying structure of the associated integrated circuit.

19. The fabrication test circuit of claim 1, wherein said current carrying structure and each test structure comprise silicided polysilicon, and wherein said current carrying structure comprises a gate of a field-effect transistor in said integrated circuit.

20. An automated fabrication test device comprising:
a plurality of monitor structures connected in parallel, each monitor structure comprising an associated test structure and threshold sensitive switch device, each test structure being predesigned relative to a current carrying structure of an associated integrated circuit such that an out-of-spec resistance in the test structure signals a possible out-of-spec resistance in the current carrying structure, the threshold sensitive switch device of each monitor structure outputting a fail signal when resistance of the associated test structure is above a predefined level, said fail signal being representative of out-of-spec resistance in the associated test structure; and
automated count means for monitoring said plurality of monitor structures for at least one fail signal output from at least one monitor structure, said fail signal output from said at least one monitor structure signalling possible out-of-spec resistance in the current carrying structure, said automated count means accumulating a total count of said at least one fail signal.

21. The automated fabrication test device of claim 20, wherein said automated count means includes means for simultaneously monitoring said plurality of monitor structures.

22. The automated fabrication test device of claim 20, wherein each threshold sensitive switch device comprises a field-effect transistor (FET), each FET outputting a fail signal when a voltage signal across the associated test structure exceeds a predefined gate threshold of said FET.

23. The automated fabrication test device of claim 20, wherein said automated count means includes means for identifying each monitor structure of said at least one monitor structure having the out-of-spec resistance.

24. The automated fabrication test device of claim 23, wherein said automated count means includes means for providing a binary count signal representative of a total count of fail signals.

25. The automated fabrication test device of claim 20, further comprising latch circuitry coupled between said plurality of monitor structures and said automated count means, said latch circuitry holding fail signals output from the at least one fail signal output from the at least one monitor structure having out-of-spec resistance for counting by said automated count means.

26. The automated fabrication test device of claim 20, wherein the threshold sensitive switch device of each monitor structure outputs a fail signal when a resistance proportional signal from the associated test structure is above a threshold level, said threshold level corresponding to said predefined level of resistance at which said fail signal is output, and wherein said resistance proportional signal comprises an analog resistance proportional signal and said fail signal comprises a digital fail signal.

27. The automated fabrication test device of claim 20, wherein said current carrying structure and each of said test structures comprise silicided polysilicon.

28. A method for fabricating a test device for indicating possible out-of-spec resistance in a current carrying structure of an integrated circuit, said method comprising the steps of:

(a) predesigning a plurality of monitor structures, each monitor structure having an associated test structure and threshold sensitive switch device, each test structure being predesigned relative to the current carrying structure of the integrated circuit such that an out-of-spec resistance in the test structure signals a possible out-of-spec resistance in the current carrying structure, the threshold sensitive switch device of each monitor structure outputting a fail signal when resistance of the associated test structure is above a predefined level, the fail signal being representative of an out-of-spec resistance in the associated test structure; and (b) fabricating said plurality of monitor structures such that said monitor structures are electrically connected in parallel and are disposed adjacent to said integrated circuit.

29. The method of claim 28, wherein said fabricating step (b) includes proceeding with fabrication of each test structure commensurate with fabrication of said current carrying structure of the integrated circuit.

30. The method of claim 28, further in combination with test monitoring said plurality of monitor structures for a fail signal representative of out-of-spec resistance in a test structure fabricated in said step (b).

31. The method of claim 30, wherein said test monitoring includes for each test structure the step of establishing a current therethrough or a voltage thereacross, said establishing step being accomplished simultaneously for said test structures in said plurality of monitor structures.

32. The method of claim 30, wherein said test monitoring includes counting each fail signal output from the plurality of monitor structures.

33. The method of claim 32, wherein said test monitoring includes providing a binary signal representative of a total count of all signals output from the plurality of monitor structures.

\* \* \* \* \*

UNITED STATES PATENT AND TRADEMARK OFFICE
CERTIFICATE OF CORRECTION

PATENT NO. : 5,485,095
DATED : Jan. 16, 1996
INVENTOR(S) : Bertsch et al.

It is certified that error appears in the above-indentified patent and that said Letters Patent is hereby corrected as shown below:

Column 4, line 2 delete "polysicilicon" and substitute therefor --polysilicon--.

Column 4, line 62, delete "to".

Column 8, line 59, after "," insert --wherein--.

Signed and Sealed this

Second Day of July, 1996

*Attest:*

BRUCE LEHMAN

*Attesting Officer*     Commissioner of Patents and Trademarks